Jan. 5, 1954 L. LENG 2,665,339

HIGH AND VERY HIGH FREQUENCY TUNABLE CIRCUITS

Filed Nov. 18, 1948

Inventor:
Leopold Leng,
By Pierce, Scheffler + Parker,
Attorneys.

Patented Jan. 5, 1954

2,665,339

UNITED STATES PATENT OFFICE 2,665,339

HIGH AND VERY HIGH FREQUENCY TUNABLE CIRCUITS

Leopold Leng, Wettingen, Switzerland, assignor to "Patelhold" Patentverwertungs- & Elektro-Holding A.-G., Glarus, Switzerland Application November 18, 1948, Serial No. 60,721

Claims priority, application Switzerland November 29, 1947

6 Claims. (Cl. 179—171)

Figure 1:
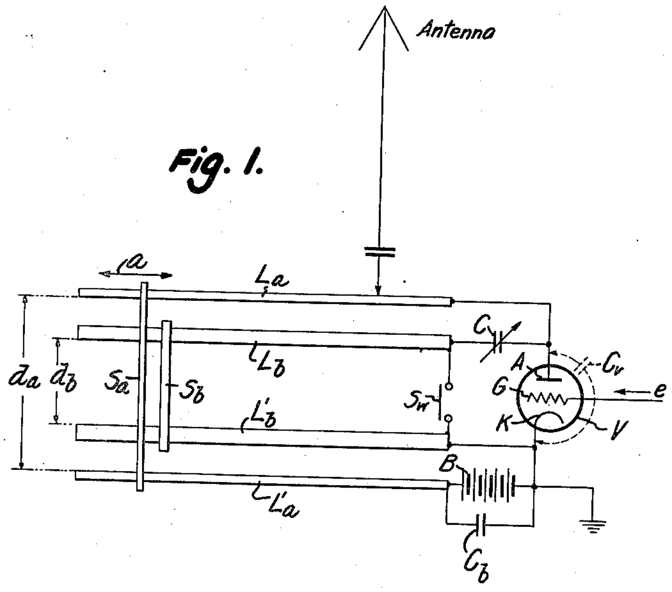

This invention relates to high and very high frequency tunable circuits, and particularly to multirange tunable circuits for use with vacuum tubes.

Difficulties have been encountered in the construction of tunable high and very high frequency circuits, and these difficulties increase with increasing frequency and with increasing power. Short wave transmitters with a power of 100 kilowatts and more have been constructed for operation over a wide band or bands in the 10 to 50 meter range, or in some instances in the 10 to 80 meter range, but the tuning systems of the prior short wave transmitters of high power have not been entirely satisfactory.

One known arrangement in which variable condensers are connected across the input elements of the tubes affords only a relatively small range of frequency change in the case of short wave transmitters of high power since a relatively large initial capacity is always present due to the inherent tube capacities and, when used, the neutralizing condensers. The introduction of additional capacitance for tuning purposes is permissible to only a slight extent since unduly large circulating currents will reduce the efficiency and may result in excessive heating.

According to another known tuning method, a variable capacitance has been connected in series with the inductance of the vacuum tube circuit. In general, this tuning system does not result in an increase in the circulating currents, and it is particularly suitable for tuning in the lower range of an ultra short wave band. For the upper range of longer wave lengths, this tuning system is open to the objection that the circuit inductance, which is inherently large for the longer wave lengths, must be made still larger since a part of the inductance is compensated by the variable capacitance. When, as is convenient, the inductance takes the form of a Lecher line, this prior tuning method necessitates a longitudinal increase in the Lecher line into space requirements which result in inefficient dimensions.

Objects of the present invention are to provide tuning systems which are more favorable, as to space requirements and/or efficiency, than the prior tuning systems. An object is to provide a tuning system for efficient operation over both the upper and the lower portions of a wide band or overlapping bands of short wave lengths. An object is to provide a multirange tuning system affording high efficiency over a plurality of wave length ranges which may, and preferably do, overlap to afford a continuously progressive tuning over a wide band of short wave lengths. More specifically, an object of the invention is to provide a multirange tuning system including a pair of Lecher lines connected across the input elements of a vacuum tube, one Lecher line being directly connected to the tube anode and the other Lecher line being connected to the tube anode through a variable condenser which may be connected across the first Lecher line, by short-circuiting the second Lecher line, to effect a range change.

Figure 2:
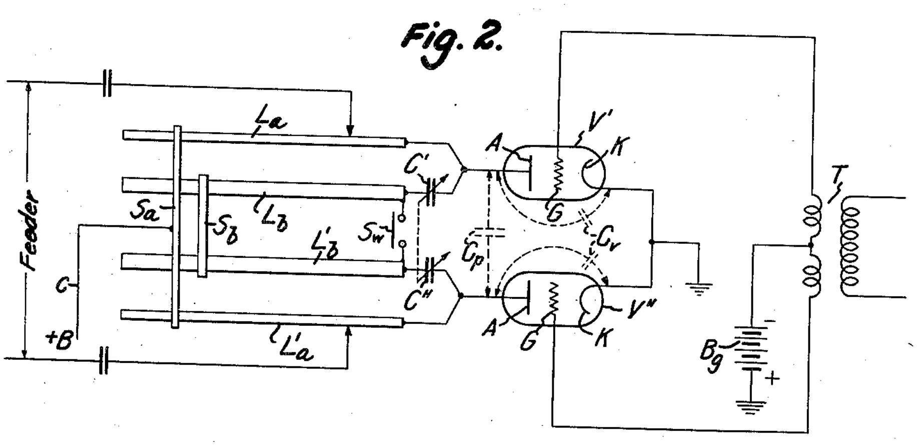

These and other objects and the advantages of the invention will be apparent from the following specification when taken with the accompanying drawings, in which:

Fig. 1 is a circuit diagram of a tuning system, for a single vacuum tube, embodying the invention; and Fig. 2 is a circuit diagram of a tuning system, for a push-pull amplifier, embodying the invention.

In Fig. 1 of the drawings, the reference character V identifies an amplifier tube of a short wave transmitter; the tube having a cathode K, a control grid G upon which an ultra short wave voltage *e* is impressed, and an anode A. The tunable network of tube V includes a pair of resonant lines $L_a$, $L'_a$ and $L_b$, $L'_b$ connected between the anode A and cathode K of the tube V and shorting bars $S_a$ and $S_b$ adjustable along the respective Lecher lines, as indicated schematically by the double-ended arrow *a*. The conductors of the resonant lines are cylindrical and may be solid or tubular, but preferably are tubular for transmitters of high power in view of the skin effect at high and ultra-high frequencies. The conductors may be linear or curved and, for convenience of description the conductor loops will be hereafter termed "Lecher lines."

Conductor $L_a$ is connected directly to the anode A, and conductor $L_b$ is connected to anode A through a variable condenser C. Conductors $L'_a$ and $L'_b$ are connected to the cathode K, and a plate voltage source B, shunted by a by-pass condenser $C_b$, may be connected between one of these conductors and the tube cathode. A range-change switch *Sw* is connected across the ends of conductors $L_b$ and $L'_b$ adjacent the tube V, or the shorting bar $S_b$ may be adjusted to short-circuit the inner ends of the conductors in lieu of the switch *Sw*.

Conventional means, not shown, is provided for a fine adjustment of the shorting bars $S_a$ and $S_b$ along the respective Lecher lines, and for clamping the shorting bars to the Lecher line conductors. The inductance provided by Lecher line $L_a$, $L'_a$ and shorting bar $S_a$ is substantially larger than the inductance of the other Lecher line, i. e. the spacing $d_a$ of the conductors $L_a$, $L'_a$ is substantially greater than the spacing $d_b$ of conductors $L_b$, $L'_b$. The diameter of the rod or tube conductors $L_b$, $L'_b$ is preferably greater than the diameter of the conductors $L_a$, $L'_a$ of the other Lecher line since, with switch *Sw* open, as shown in Fig. 1, the Lecher line $L_b$, $L'_b$ is of major importance in determining the tuning at the shorter wave lengths.

The Lecher lines are adjustable inductances which, with the inherent anode-cathode capacity $C_v$ and other distributed capacities, comprise the basic elements of the oscillatory circuit. An approximate tuning to a frequency or frequency range is effected by adjustment of the shorting bars $S_a$ and $S_b$. With Lecher line $L_b$, $L'_b$, $S_b$ shorted at its inner end, by adjustment of the shorting bar $S_b$ or the closing of the range-change switch *Sw*, the resonant frequency of the tuning system is determined primarily by the larger inductance of the conductor loop $L_a$, $L'_a$, $S_a$. The frequency may be varied over a range by adjustment of the variable condenser C which, with switch *Sw* closed, is in parallel with the tube capacity $C_v$, the distributed capacity of the connecting leads and, if present, the neutralizing condensers. Relatively low resonance frequencies are obtained with this arrangement of a relatively large total capacitance in parallel with the inductance of the larger Lecher line.

With the switch *Sw* open, the tube circuit is tunable over a range of very short wave lengths by adjustment of the variable condenser C. The condenser C is now in series with the relatively small inductance of the Lecher line $L_b$, $L'_b$, $S_b$; and this smaller inductance is the decisive factor which determines the tuning range. The larger inductance of the other line is in parallel with the series tuned Lecher line and it effects the tuning since it shifts the tuning range towards higher frequencies.

The circuit values are preferably so selected that the tuning ranges overlap slightly and, to keep the overlap small, the difference between the effective inductances or ranges of inductance variation of Lecher lines $L_a$, $L'_a$ and $L_b$, $L'_b$ is made as great as possible by appropriate selection of the spacing values $d_a$, $d_b$.

In the case of a push-pull amplifier stage, see Fig. 2, the ends of the center-tapped secondary winding of an input transformer T are connected to the grids G of a pair of tubes V', V'', the tube cathodes K are grounded and a source of bias voltage $B_g$ is connected between the center tap and ground. The Lecher lines may be substantially as previously described, but with the conductors $L_a$, $L'_a$ of the line of larger inductance connected directly to the anodes A of the respective tubes, and with variable condensers C', C'' connected between the inner ends of conductors $L_b$, $L'_b$ and the anodes of the respective tubes. The voltage supply to the anodes is through a connection c from the shorting bar $S_a$ to a source of direct current voltage, indicated by the symbol "+B". A range-change switch *Sw* is connected across the inner ends of the conductors $L_b$, $L'_b$ of the Lecher line of lower inductance value but, as in the other form of the invention, the switch *Sw* may be omitted when the shorting bar $S_b$ is adjustable to the extreme inner ends of the associated conductors. When the switch *Sw* is closed, the adjustable condensers C' and C'' are connected in series across the anodes of the tubes V', V'', i. e. in parallel with the inherent capacitance *Cp* between the anodes. The anode-cathode capacitances $C_v$ of the tubes should be kept as low as possible, by an appropriate choice of tube types, to obtain maximum tuning ranges.

The operating characteristics of the tuning system as applied to a push-pull amplifier are substantially the same as those described above for the tuning system of a single amplifier tube.

It is to be understood that the invention is not limited to the particular circuits herein shown and described since the specific form of the resonant lines may be varied, and the tuning systems may be employed with oscillator tubes or in a high or very high frequency network at points not directly associated with amplifier or oscillator tubes.

I claim:

1. In a dual range tuning system for high and very high frequencies, the combination with a pair of vacuum tubes each having a grid and anode cooperating with a cathode, of a tunable network comprising a pair of inductors of different inductance values, the ends of the inductor of greater inductance being conductively connected to the respective anodes of said tubes, variable condensers connected between the ends of the other inductor and the respective anodes, and means for shorting the said ends of the other inductor, thereby to connect said condensers in series between said anodes.

2. In a tuning system for high and very high frequencies, the invention as recited in claim 1, wherein said inductors each comprises a pair of parallel conductors and a shorting bar; one set of adjacent ends of each pair of parallel conductors constituting said ends of the inductors connected to said anodes, and the shorting bars of each pair of parallel conductors being adjustable along the same adjacent the other set of adjacent ends thereof.

3. In a tuning system for high and very high frequencies, the invention as recited in claim 2, in combination with an anode voltage supply connection to the shorting bar of the inductor of greater inductance.

4. The combination of electron tube means having a pair of electrodes constituting terminals across which a tunable network may be connected, of a dual range tuning system comprising a pair of Lecher lines of different inductance values and each including a pair of parallel conductors and a shorting bar adjustable along the same, means effectively connecting the inner ends of the parallel conductors of the Lecher line of larger inductance value directly across said pair of electrodes for currents of high and very high frequency values, means connecting the inner ends of the conductors of said other Lecher line across said electrodes in parallel with said Lecher line of larger inductance value, said last connecting means including capacitive impedance serially connected between at least one of the inner ends of said other Lecher line and said tube electrodes, and means adjustable to connect said capacitive impedance across said electrodes in parallel with said Lecher line of larger inductance value and simultaneously to minimize the effective impedance of said other Lecher line, said adjustable means comprising means for shorting the inner ends of the parallel conductors of said other Lecher line.

5. The invention as recited in claim 4, wherein said electron tube means comprises a single electron tube having an anode and a cathode constituting said pair of electrodes across which said tuning system is connected.

6. The invention as recited in claim 4, wherein said electron tube means comprises a pair of electron tubes each having a grid and an anode cooperating with a cathode, said anodes constituting said pair of electrodes across which said tuning system is connected.

LEOPOLD LENG.

References Cited in the file of this patent

UNITED STATES PATENTS

| Number | Name | Date |
|---|---|---|
| 1,857,055 | MacDonald | May 3, 1932 |
| 2,085,403 | Van Loon et al. | June 29, 1937 |
| 2,260,164 | Brown et al. | Oct. 21, 1941 |
| 2,262,365 | Kinn | Nov. 11, 1941 |
| 2,342,254 | Dallenbach | Feb. 22, 1944 |
| 2,405,229 | Mueller et al. | Aug. 6, 1946 |
| 2,408,895 | Turner | Oct. 8, 1946 |
| 2,421,784 | Haeseler et al. | June 10, 1947 |
| 2,544,832 | Hadley | Mar. 13, 1951 |